United States Patent
Krugly

(10) Patent No.: US 6,741,099 B1
(45) Date of Patent: May 25, 2004

(54) TRANSISTOR DRIVER CIRCUIT

(75) Inventor: Simon Krugly, Camarillo, CA (US)

(73) Assignee: Power-One Limited (KN)

( * ) Notice: Subject to any disclaimer, the term of this patent is extended or adjusted under 35 U.S.C. 154(b) by 0 days.

(21) Appl. No.: 10/357,313

(22) Filed: Jan. 31, 2003

(51) Int. Cl.$^7$ .......................................... H03K 19/0175
(52) U.S. Cl. .............................. 326/82; 326/17; 326/26; 326/27; 326/83; 326/86; 326/112; 326/119
(58) Field of Search .............................. 326/17, 26, 27, 326/82, 83, 86, 112, 119

(56) References Cited

U.S. PATENT DOCUMENTS

| | | | |
|---|---|---|---|
| 5,481,219 A | * | 1/1996 | Jacobs et al. ................ 327/434 |
| 6,218,891 B1 | * | 4/2001 | Lotfi et al. ................... 327/431 |
| 6,251,716 B1 | | 6/2001 | Yu |
| 6,281,705 B1 | | 8/2001 | Yu |
| 6,307,223 B1 | | 10/2001 | Yu |
| 6,349,047 B1 | | 2/2002 | Yu |
| 6,355,513 B1 | | 3/2002 | Yu |
| 6,356,059 B1 | | 3/2002 | Yu |
| 6,486,011 B1 | | 11/2002 | Yu |
| 6,661,276 B1 | * | 12/2003 | Chang ......................... 327/427 |

OTHER PUBLICATIONS

PWRLITE–LVTS103N Data Sheet [online], [retrieved on Apr. 11, 2003]. Retrieved from the Internet: <http://www.lovoltech.com/lvts103n.pdf> p. 1–4.

Lovoltech Products [online], [retrieved on Apr. 11, 2003]. Retrieved from the Internet: <http://www.lovoltech.com/products.htm> (1 page).

* cited by examiner

*Primary Examiner*—Michael Tokar
*Assistant Examiner*—Khai M. Nguyen
(74) *Attorney, Agent, or Firm*—Knobbe, Martens, Olson & Bear, LLP.

(57) ABSTRACT

The invention is related to methods and apparatus for driving transistors. One embodiment includes a driver circuit that can drive power transistors at relatively high switching speeds, which can advantageously decrease the size of associated electronics systems that use the driver circuit and power transistors. Embodiments of the invention can drive a switching device that needs a negative voltage bias in order to be shut off. For example, the switching device can correspond to a junction field effect transistor (JFET). Advantageously, one embodiment of the invention can drive such switching devices on and off from a single positive voltage supply.

31 Claims, 4 Drawing Sheets

TRANSISTOR DRIVER CIRCUIT

BACKGROUND OF THE INVENTION

1. Field of the Invention

The invention generally relates to circuits and in particular, to drive circuits for transistors.

2. Description of the Related Art

Power transistors are often used in switching applications, i.e., alternating between an "on" state and an "off" state. For example, power transistors can be found in switching power supplies. These switching power supplies can be found in many different types of electronic equipment, such as power supplies for computers and telecommunications equipment. Other applications for switching power transistors include switching regulators, servos, motor controls, amplifiers, transmitters, and the like.

There are many types of power transistors. Examples include bipolar junction transistors (BJTs), metal oxide semiconductor field effect transistors (MOSFETs), insulated gate bipolar transistors (IGBTs), and the like. A control input of a power transistor is coupled to a driver circuit, which drives the control input of the power transistor to achieve the desired "on" or "off" state. Desirably, a driver circuit for a device is matched to the input characteristics of the device.

A relatively new power transistor is a power junction field effect transistor (power JFET). However, power JFET devices pose certain challenges to driver circuits.

SUMMARY OF THE INVENTION

Embodiments of the invention include a driver circuit for a transistor, such as a power transistor. The driver circuit can turn the driven transistor on and off in response to a control signal. In an "on" state, the driver circuit provides the input of the driven transistor with a positive bias. In an "off" state, the driver circuit provides the input of the driven transistor with a negative bias. The negative bias can be applied to transistors, such as to junction field effect transistors (JFETs), which use the negative bias to turn off. Advantageously, this negative bias can be optionally generated within the driver circuit without the need for a negative voltage supply or negative bias supplied to the driver circuit.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF THE PREFERRED EMBODIMENTS

Figure 1:
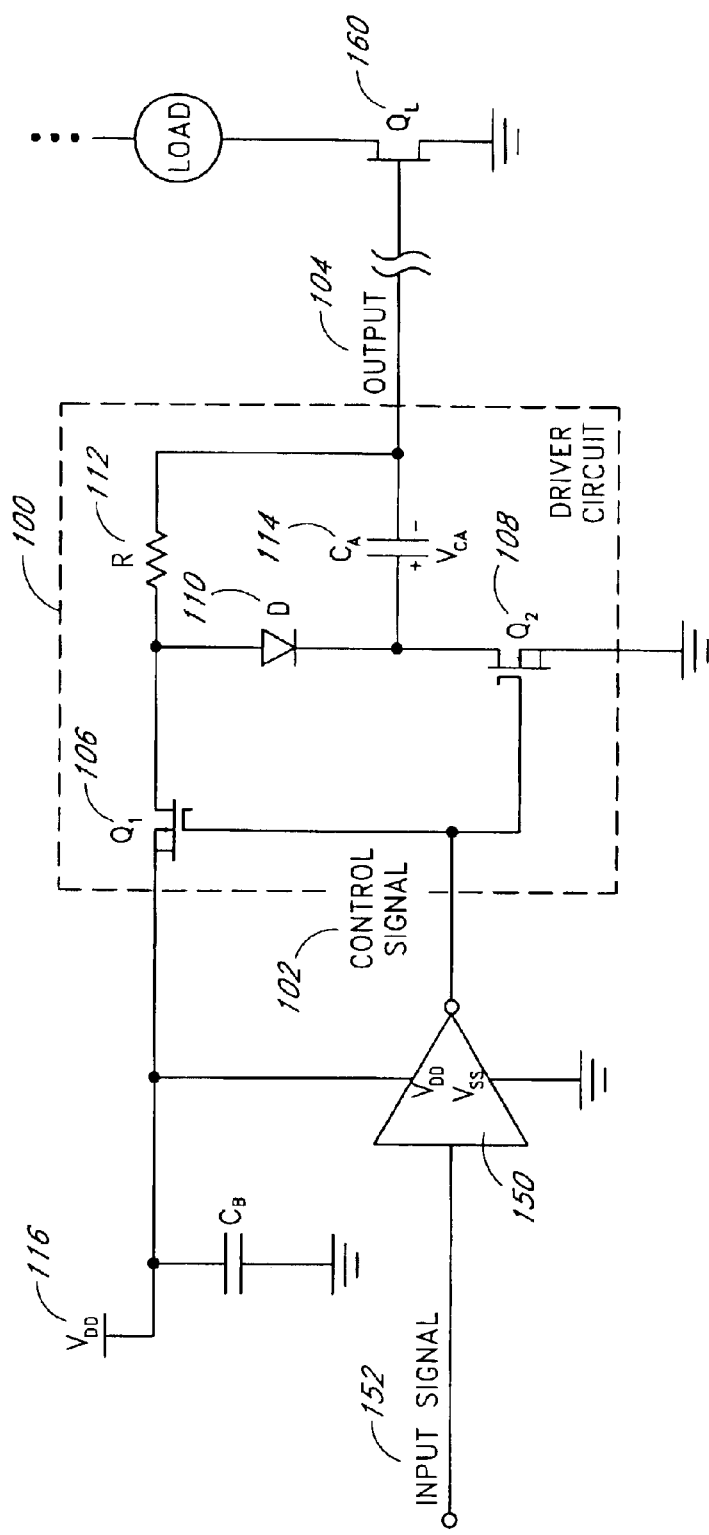
FIG. 1 illustrates a driver circuit according to one embodiment of the invention.

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

One embodiment of the invention includes a driver circuit that can drive power transistors at relatively high switching speeds, with relatively high efficiency, and at relatively low cost. One embodiment of the driver circuit can advantageously operate from only a single positive voltage supply or bias and yet provide a negative voltage to an input of a driven device, such as to the gate of a junction field effect transistor (JFET). Advantageously, this permits the use of power transistors that use a negative control bias in an application such as a power supply regardless of the presence or absence of a corresponding negative power supply bias, thereby advantageously permitting power transistors used in a variety of applications and facilitating reuse of existing designs.

Driver circuits should be configured to generate appropriate output waveforms for the control inputs of corresponding power transistors. In addition, driver circuits are preferably relatively small and compact, can preferably operate from relatively few biases, are preferably compatible with standard control signal levels, such as logic levels, and can preferably support relatively high switching rates. Devices with relatively high switching rates can be desirable in many applications.

For example, increasing the switching speed of a switch mode power supply can permit the size, the weight, and the cost of the power supply to be reduced. An increase in the switching speed of an electronic device can typically permit less costly smaller capacitors, inductors, and transformers to be used. Moreover, an increase in the operating frequency can also permit increases in performance through higher closed loop bandwidths and the like. In one embodiment, where the power transistors are used in a Class-D switch-mode audio amplifier, the increasing in switching frequency advantageously provides a reduction in the distortion of the amplifier.

One relatively new power switching device that can switch at relatively high frequencies with relatively high efficiency is a power JFET. One example of a power JFET is an N-Channel vertical power JFET available from Lovoltech, Inc. of Santa Clara, Calif. A power JFET is described in U.S. Pat. No. 6,251,716 to Ho-Yuan Yu. However, a characteristic of a depletion mode or "normally on" JFET is that a negative voltage bias is applied from gate to source of the JFET in order to turn the JFET off. With many other transistor configurations, such a negative voltage bias is not required at a control input. As a result, existing drivers are typically not compatible with transistors, such as depletion mode JFETs, which use negative voltage biases at a control input to turn off.

Embodiments of the invention advantageously provide a positive bias to the control input of a transistor, such as a JFET, to turn the transistor on and also provides a negative bias to the control input of the transistor to turn the transistor off. Advantageously, one embodiment of a driver circuit can provide the negative bias even in the absence of a negative voltage supply or bias for the driver circuit. This advantageously permits the driver circuit to be used in many systems that do not provide an appropriate negative voltage supply or bias.

FIG. 1 illustrates a driver circuit 100 according to one embodiment of the invention. The illustrated driver circuit 100 receives a control signal 102 as an input and provides an output 104 in response to the control signal 102. The output 104 provides a drive signal that can be applied to an input of a transistor, e.g., a gate drive to a JFET. The driver circuit 100 is configured to switch on a positive bias, such as positive flowing current, to the output 104 in response to a first state of the control signal 102 and is configured to provide a negative bias, such as a negative voltage, on the output 104 in response to a second state of the control signal 102. The illustrated driver circuit 100 can be fabricated in a variety of ways, such as from discrete devices, in a hybrid, in an integrated circuit, and the like.

For relatively high switching speeds, the control signal 102 should be provided from a circuit with relatively low output resistance, such as from a buffer circuit 150, which will be described later. In one embodiment, the buffer circuit 150 can be part of the driver circuit 100. In another embodiment, a control circuit with a suitable output characteristic provides the control signal 102 for the driver circuit 100. Examples of control circuits that can use the driver circuit 100 include control circuits for switch mode power supplies, control circuits for switching regulators, control circuits for pulse width modulating class D audio amplifiers, and the like.

The driver circuit 100 includes a first switching device, a second switching device, and a rectifying device. In the embodiment illustrated in FIG. 1, the first switching device, the second switching device, and the rectifying device correspond to a P-Channel metal oxide semiconductor field effect transistor (P-Channel MOSFET) $Q_1$ 106, to an N-Channel metal oxide semiconductor field effect transistor (N-Channel MOSFET) $Q_2$ 108, and to a diode D 110.

In one embodiment, the P-Channel MOSFET $Q_1$ 106 corresponds to a P-Channel MOSFET NDS352AP available from Fairchild Semiconductor International Inc., of South Portland, Me.; the N-Channel MOSFET $Q_2$ 108 corresponds to an N-Channel MOSFET FDV303N available from Fairchild Semiconductor International Inc.; and the diode D 110 corresponds to a PMBD7000 high-speed diode available from Phillips Semiconductors of The Netherlands. While illustrated in the context of MOSFETs and a diode, one of ordinary skill in the art will appreciate that the principles and advantages described herein are applicable to other types of devices, such as bipolar junction transistors (BJTs). For example, in another embodiment, a PNP BJT and an NPN BJT can be substituted for a P-Channel MOSFET and for an N-Channel MOSFET, respectively, with appropriate biasing resistors in series with the bases of the BJTs. In another embodiment, an active device can be used for the rectifying device as described later in connection with FIG. 4. Selection of other devices will be readily determined by one of ordinary skill in the art. The driver circuit 100 illustrated in FIG. 1 also includes a resistor R 112 and a capacitor $C_A$ 114.

In the driver circuit 100, the control signal 102 is coupled to the gate of the P-Channel MOSFET $Q_1$ 106 and to the gate of the N-Channel MOSFET $Q_2$ 108. The source of the P-Channel MOSFET $Q_1$ 106 is coupled to a positive supply voltage $V_{DD}$ 116. It will be understood by one of ordinary skill in the art that a bypass capacitor $C_B$ 118 can be included on the positive supply voltage $V_{DD}$ 116. The drain of the P-Channel MOSFET $Q_1$ 106 is coupled to a first terminal of the resistor R 112 and to the anode of the diode D 110. The cathode of the diode D 110 is coupled to a first terminal of the capacitor $C_A$ 114 and to the drain of the N-Channel MOSFET $Q_2$ 108. The source of the N-Channel MOSFET $Q_2$ 108 is advantageously coupled to ground in the illustrated embodiment. A second terminal of the resistor R 112 is coupled to a second terminal of the capacitor $C_A$ 114 and to the output 104, which can provide a transistor that is driven by the driver circuit, such as the JFET $Q_L$ 160 illustrated in FIG. 1, with a drive signal.

The control signal 102 transitions between a first state and a second state. These states can correspond to standard logic levels or to levels that are tailored to a particular application. In one embodiment, the circuit that provides the control signal 102, e.g., the buffer circuit 150, provides voltage levels for the first state and for the second state that approximately correspond to the positive supply voltage $V_{DD}$ 116 and to ground, respectively. In the illustrated driver circuit 100, no negative supply voltage is used such that the driver circuit 100 can advantageously operate from only a single power supply voltage. It will be understood, however, that in another embodiment, the driver circuit can be configured to use more than one power supply voltage. For example, the driver circuit 100 can be configured to operate with the positive supply voltage $V_{DD}$ 116 set to +5 Volts and with ground.

The operation of the driver circuit 100 will now be described with the first state of the control signal 102 corresponding to a low level, i.e., to approximately ground, and with the second state of the control signal 102 corresponding to a high level, i.e., to approximately the voltage level of the positive supply voltage $V_{DD}$ 116.

The first state of the control signal 102 provides a relatively high negative voltage from gate to source across the P-Channel MOSFET $Q_1$ 106, e.g., about $+V_{DD}$ from source to gate. This turns on the P-Channel MOSFET $Q_1$ 106 such that there is relatively low resistance between the drain and the source of the P-Channel MOSFET $Q_1$ 106. In addition, the first state of the control signal 102 provides a relatively low voltage from gate to source across the N-Channel MOSFET $Q_2$ 108, e.g., about 0V. This turns off the N-Channel MOSFET $Q_2$ 108 such that there is relatively little conductance between the drain and the source of the N-Channel MOSFET $Q_2$ 108.

Figure 2:
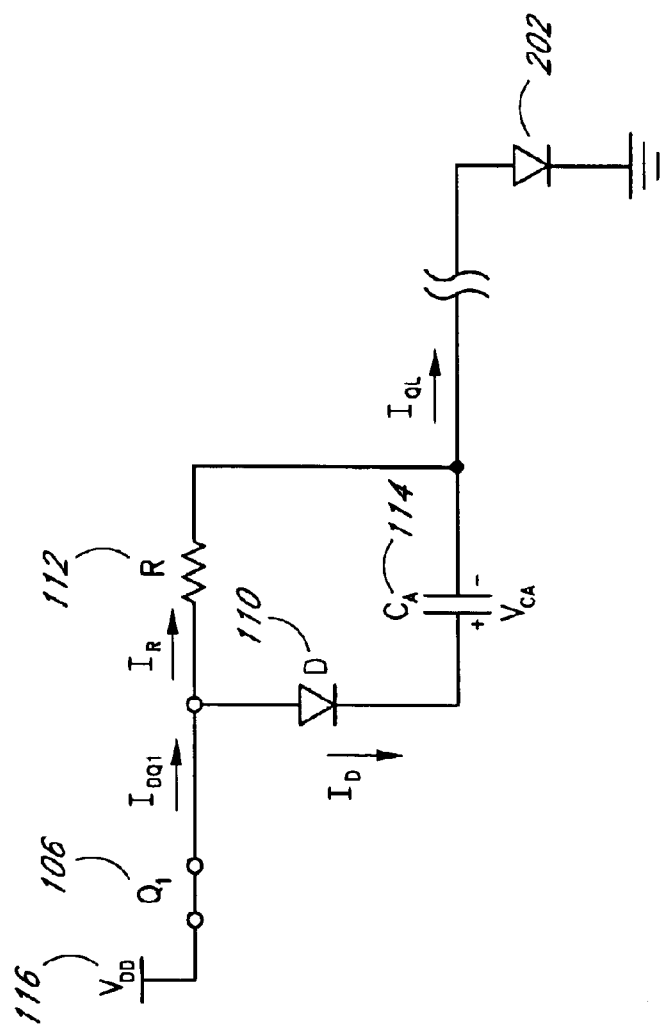
FIG. 2 illustrates a model of the driver circuit in a first state.

A model simplified for clarity of the driver circuit 100 in a state corresponding to the first state of the control signal 102 is provided in FIG. 2. In FIG. 2, the input of the driven transistor or the JFET $Q_L$ 160 is modeled as a diode 202. With relatively high conductivity between the drain and the source of the P-Channel MOSFET $Q_1$ 106, the "on" state of the P-Channel MOSFET $Q_1$ 106 couples the anode of the diode D 110 and the first terminal of the resistor R 112 to the positive supply voltage $V_{DD}$ 116. The current $I_{DQ1}$ that flows from the source to the drain of the P-Channel MOSFET $Q_1$ 106 divides into a resistor current $I_R$ and a diode current $I_D$. The resistor current $I_R$ and the diode current $I_D$ recombine to the load current $I_{QL}$, which is provided to the driven transistor. These relationships are expressed in Equation 1.

$$I_{DQ1} = I_R + I_D = I_{QL} \tag{Eq. 1}$$

The diode current $I_D$ charges the capacitor $C_A$ 114. It will be understood by one of ordinary skill in the art that the capacitor $C_A$ 114 can be formed from one or more capacitors. The amount of capacitance for the capacitor $C_A$ 114 can vary in a very broad range and can depend on the size and the number of transistors driven by the driver circuit 100. The amount of capacitance should be sufficient to reverse bias the input of the driven transistor, e.g., to reverse bias the gate to source of the JFET $Q_L$ 160, as will be described in greater detail later in connection with FIG. 3. In one embodiment, where the driven transistor has an input characteristic of a diode, such as the JFET $Q_L$ 160, the amount of capacitance should also be sufficient to compensate for discharge through the reverse recovery current of the of the input diode of the JFET $Q_L$ 160. In one embodiment, the capacitance of the capacitor $C_A$ 114 is about 2200 picofarads (pf). Other values for capacitance will be readily determined by one of ordinary skill in the art.

In the illustrated driver circuit 100, the capacitor charges to a voltage of $V_{CA}$, which is expressed in Equation 2, which has been simplified for clarity. In Equation 2, $V_{BE}$ indicates a diode drop as encountered in the voltage loop at the diode D 110 and at the input of the driven transistor, which is modeled as a diode 202. It will be understood by the skilled practitioner that the diode drops may not be equal.

$$V_{CA} = V_{DD} - 2V_{BE} \tag{Eq. 2}$$

When the capacitor $C_A$ 114 is charged, the diode current $I_D$ diminishes such that the resistor current $I_R$ is approximately the same as the current $I_{QL}$ flowing through the input of the driven transistor. This relationship is expressed in Equation 3.

$$I_{QL} = I_R + I_D \approx I_R \tag{Eq. 3}$$

The resistor current IR component of the load current $I_{QL}$ can provide the driven transistor with a forward bias such that the load transistor turns on. One of ordinary skill in the art will appreciate that even though a JFET may be "normally on" with relatively little bias applied at the gate, a positive bias can be applied to the input of the JFET to enhance the conductivity of the JFET from drain to source, i.e., to turn the JFET on harder. When the capacitor $C_A$ 114 is charged and the driven transistor has an input characteristic of a forward-biased diode as shown in FIG. 2, the voltage across the resistor R 112 is approximately the positive supply voltage $V_{DD}$ 116 minus the diode drop at the input of the driven transistor. The resistor current $I_R$, and using Equation 3, the current $I_{QL}$ flowing through the input of the driven transistor, can be approximately expressed by Equation 4.

$$I_{QL} \approx I_R = \frac{V_{DD} - V_{BE}}{R} \tag{Eq. 4}$$

In Equation 4, $V_{BE}$ represents the voltage drop of the diode drop at the input of the driven transistor, which is modeled as the diode 202. As illustrated by Equation 4, the resistor current $I_R$ varies approximately inversely with the value of the resistor R 112. Accordingly, the value of the resistor R 112 can be selected to provide the transistor to be driven, e.g., the JFET $Q_L$ 160, with the desired amount of input drive current. It will be understood that parasitic resistances, such as circuit board trace resistances and the "on" resistance of the P-Channel MOSFET $Q_1$ 106 can also be included in the denominator of Equation 4. In one embodiment, where the positive supply voltage $V_{DD}$ 116 is about +5 Volts, the resistance of the resistor R 112 is about 50 ohms. It will be understood, however, that the amount of resistance for the resistor R 112 can vary in a very broad range depending on the amount of voltage of the positive supply voltage $V_{DD}$ 116, the size and characteristics of the driven transistor, e.g., the JFET $Q_L$ 160, the number of transistor driven where paralleled, etc. In addition, it will be understood by one of ordinary skill in the art that the resistor R 112 can be distributed among one or more resistors.

Operation of the driver circuit 100 will now be described with respect to the second state of the control signal 102. In the second state of the control signal 102, the voltage level of the control signal 102 is relatively high and in one embodiment is about at the level of the positive supply voltage $V_{DD}$ 116. The second state of the control signal 102 results in relatively little voltage drop from gate to source across the P-Channel MOSFET $Q_1$ 106, e.g., about 0V, which thereby turns off the P-channel MOSFET $Q_1$ 106 such that there is relatively little conductivity between the drain and the source of the P-Channel MOSFET $Q_1$ 106. The second state of the control signal 102 provides a relatively high voltage to drop across the gate to source of the N-Channel MOSFET $Q_2$ 108, e.g., about $V_{DD}$ from gate to source, thereby turning the N-Channel MOSFET $Q_2$ 108 on so that there is relatively little resistance between the drain and the source of the N-Channel MOSFET $Q_2$ 108.

Figure 3:
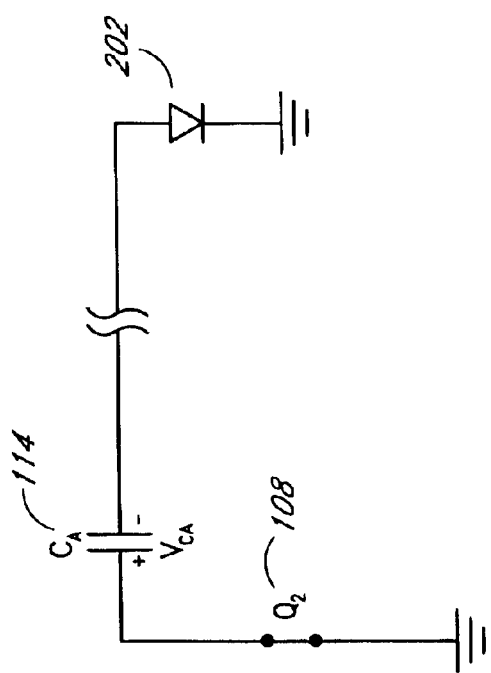
FIG. 3 illustrates a model of the driver circuit in a second state.

A simplified equivalent circuit of the driver circuit 100 in a state corresponding to the second state of the control signal 102 is provided in FIG. 3. Turning the N-Channel MOSFET $Q_2$ 108 to the "on" state effectively ties the first terminal of the capacitor $C_A$ 114 to ground. The diode D 110 prevents the capacitor $C_A$ 114 from discharging via the resistor R 112, thereby advantageously permitting the amount of capacitance for the capacitor $C_A$ 114 to be relatively low. This permits the negative of the voltage stored $V_{CA}$ to be applied to the input of the driven transistor or the JFET $Q_L$ 160, which is represented in FIG. 3 as the diode 202. Where the driven transistor is the JFET $Q_L$ 160, the negative voltage reverse biases the gate to source so that the JFET is shut off, i.e., is not conductive. Advantageously, the driver circuit 100 provides this negative voltage on the output 104 without a negative power supply voltage bias or the use of transformer coupling.

In one embodiment, the control signal 102 transitions between the first state and second state at a relatively high frequency. Relatively high frequency switching can be beneficial in reducing the cost, the size, and the weight of other components. In one example, the driver circuit 100 receives the control signal 102 and correspondingly drives a power transistor coupled to the output 104 at a rate of about 500 kHz, which is relatively high for a power device.

As described earlier, for relatively high switching speeds, the control signal 102 should be provided from a source of relatively low output resistance such as the buffer circuit 150. The buffer circuit 150 can also be used to perform a level shift. One example of the buffer circuit 150 is a MOSFET driver IXDN402SI available from IXYS Corporation of Santa Clara, Calif. The buffer circuit 150 can be incorporated with the driver circuit 100. However, it will be understood by one of ordinary skill in the art that control circuits can already provide suitable output levels and low enough output impedance for driving the input of the driver circuit 100. It should be noted that the illustrated portion of the driver circuit 100 is logically inverting. Thus, it may be desirable in some applications to include a buffer circuit that is inverting, such as the buffer circuit 150 as shown in the illustrated embodiment of FIG. 1, such that the logical state from an input 152 to the output 104 is not inverted. In another embodiment, the buffer circuit is non-inverting.

Figure 4:
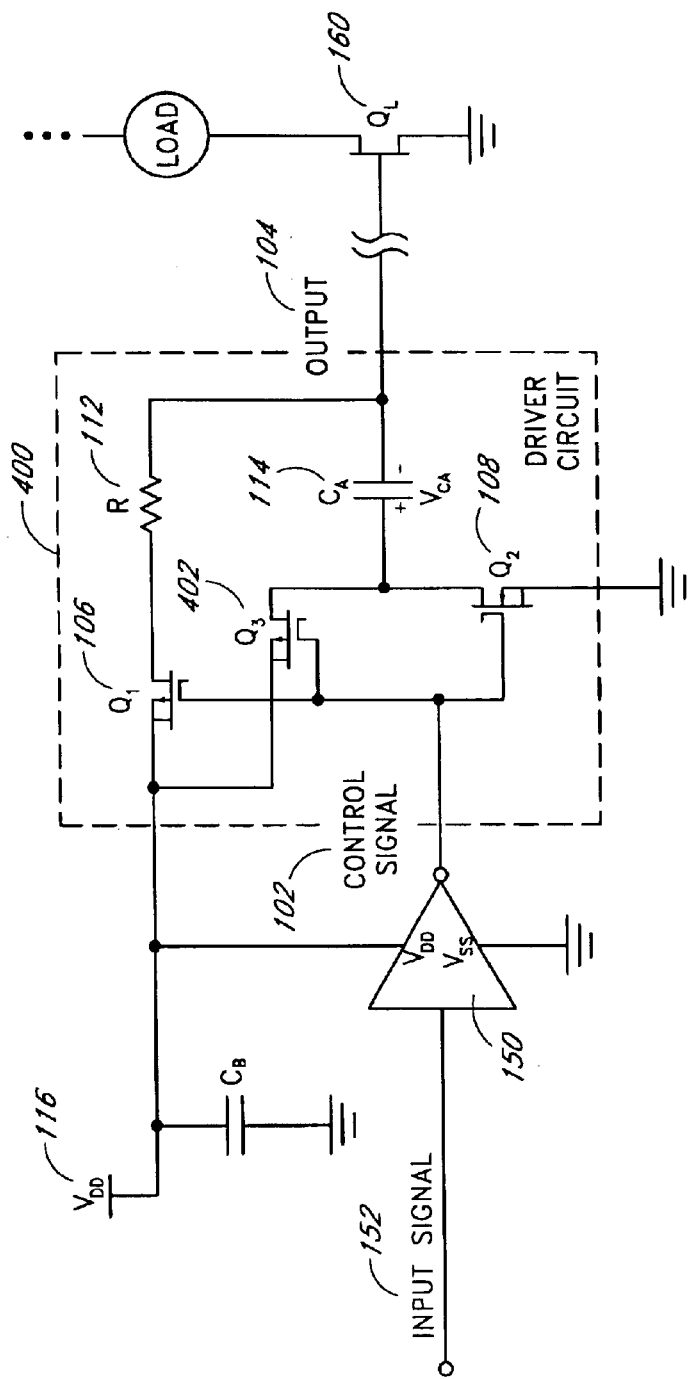
FIG. 4 illustrates an alternative embodiment of the driver circuit.

FIG. 4 illustrates a driver circuit 400 according to another embodiment of the invention. Operation of the driver circuit 400 of FIG. 4 is similar to the operation of the driver circuit 100 described earlier in connection with FIG. 1. In the driver circuit 400, the rectifying device is actively switched. In the illustrated embodiment of the driver circuit 400, the rectifying device is a second P-Channel MOSFET $Q_3$ 402, but it will be apparent to skill in the art that other devices can be used.

In the illustrated driver circuit 400, the gate of the second P-Channel MOSFET $Q_3$ 402 is tied to the same node as the gate of the P-Channel MOSFET $Q_1$ 106. The source of the second P-Channel MOSFET $Q_3$ 402 is also tied to the same node as the source of the P-Channel MOSFET $Q_1$ 106. The second P-Channel MOSFET $Q_3$ 402 and the P-Channel MOSFET $Q_1$ 106 thereby switch on and switch off at approximately the same time.

The second P-Channel MOSFET $Q_3$ 402 and the P-Channel MOSFET $Q_1$ 106 both turn on when the control signal 102 is in the first state, i.e., is relatively low. The second P-Channel MOSFET Q₃ 402 and the P-Channel MOSFET Q₁ 106 both turn off when the control signal 102 is in the second state, i.e., is relatively high. When turned on, the second P-Channel MOSFET Q₃ 402 ties the first terminal of the capacitor $C_A$ 114 to the positive supply voltage $V_{DD}$ 116, and thereby permits charging of the capacitor $C_A$ 114. When turned "off," the second P-Channel MOSFET Q₃ 402 prevents the capacitor $C_A$ 114 from discharging through an undesired path such as through the resistor R 112.

Embodiments of the invention can advantageously provide an input drive to a transistor, such as to a power JFET, such that a positive bias is provided to turn the transistor on and a negative bias is provided to turn the transistor off. Further advantageously, the drive circuits disclosed can operate from a single power supply bias, though it will be understood by the skilled practitioner that additional biases can also be used.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A gate drive circuit for an N-Channel junction field effect transistor (JFET), the gate drive circuit comprising:
a P-Channel metal oxide semiconductor field effect transistor (P-Ch MOSFET) with a gate, a source, and a drain, where the gate of the P-Ch MOSFET is configured to receive a control signal for the gate drive circuit, and where the source of the P-Ch MOSFET is configured to couple to a positive voltage bias;
an N-Channel metal oxide semiconductor field effect transistor (N-Ch MOSFET) with a gate, a source, and a drain, where the gate of the N-Ch MOSFET is coupled to the gate of the P-Ch MOSFET such that the P-Ch MOSFET and the N-Ch MOSFET are responsive to the control signal, where the source of the N-Ch MOSFET is configured to couple to ground;
a diode with an anode and a cathode, where the anode is coupled to the drain of the P-Ch MOSFET and the cathode is coupled to the drain of the N-Ch MOSFET;
a resistor with a first terminal and a second terminal, where the first terminal of the resistor is coupled to the drain of the P-Ch MOSFET; and
a capacitor with a first terminal and a second terminal, where the first terminal of the capacitor is coupled to the drain of the N-Ch MOSFET, and where the second terminal of the capacitor is coupled to the second terminal of the resistor and is provided as an output of the gate drive circuit.

2. The gate drive circuit as defined in claim 1, further comprising a buffer circuit configured to generate the control signal input.

3. The gate drive circuit as defined in claim 1, where the control signal input swings from approximately ground to approximately the positive voltage bias.

4. A power supply embodying the gate drive circuit of claim 1.

5. A transistor input drive circuit comprising:
a first switching device with a control terminal, a first switching terminal, and a second switching terminal, where the control terminal of the first switching device is configured to receive a control signal for the transistor input drive circuit such that the first switching device is conductive from the first switching terminal to the second switching terminal in a first state of the control signal and is not conductive from the first switching terminal to the second switching terminal in a second state of the control signal, and where the first switching terminal of the first switching device is configured to couple to a first voltage reference;
a second switching device with a control terminal, a first switching terminal, and a second switching terminal, where the control terminal of the second switching device is coupled to the control signal such that the second switching device is not conductive from the first switching terminal to the second switching terminal in the first state of the control signal and is conductive from the first switching terminal to the second switching terminal in the second state of the control signal, where the first switching terminal of the second switching device is configured to couple to a second voltage reference;
a rectifying device with at least a first terminal and a second terminal, where a first terminal of the rectifying device is coupled to a source of supply for the first voltage reference at least during the first state of the control signal, where the rectifying device is configured to provide conduction from the first voltage reference to the second terminal during the first state but not during the second state of the control signal, where the second terminal is coupled to the second switching terminal of the second switching device;
a resistor with a first terminal and a second terminal, where the first terminal of the resistor is coupled to the second switching terminal of the second switching device; and
a capacitor with a first terminal and a second terminal, where the first terminal of the capacitor is coupled to the second switching terminal of the second switching device, and where the second terminal of the capacitor is coupled to the second terminal of the resistor and is provided as an output of the gate drive circuit.

6. The transistor input drive circuit as defined in claim 5, wherein the first voltage reference is a positive voltage reference, and the second voltage reference is ground.

7. The gate drive circuit as defined in claim 5, further comprising a buffer circuit configured to generate the control signal, where the buffer circuit is configured to provide a low impedance to the first voltage reference in the second state and a low impedance to the second voltage reference in the first state in response to an input signal to the buffer circuit.

8. The transistor input drive circuit as defined in claim 5, wherein the first switching device is a P-Channel metal oxide semiconductor field effect transistor (P-Ch MOSFET), where the control terminal of the first switching device corresponds to a gate of the P-Ch MOSFET, where the first switching terminal of the first switching device corresponds to a source of the P-Ch MOSFET, and where the second switching terminal of the first switching device corresponds to a drain of the P-Ch MOSFET.

9. The transistor input drive circuit as defined in claim 5, wherein the second switching device is an N-Channel metal oxide semiconductor field effect transistor (N-Ch MOSFET), where the control terminal of the second switching device corresponds to a gate of the N-Ch MOSFET, where the first switching terminal of the second switching device corresponds to a source of the N-Ch MOSFET, and where the second switching terminal of the second switching device corresponds to a drain of the N-Ch MOSFET.

10. The transistor input drive circuit as defined in claim 5, wherein the rectifying device corresponds to a diode with an anode and a cathode, where the first terminal of the rectifying device corresponds to the anode of the diode, where the second terminal of the rectifying device corresponds to the cathode of the diode, and where the anode of the diode is coupled to the second switching terminal of the first switching device such that the first terminal of the rectifying device is coupled to the source of the first voltage reference via the first switching device.

11. The transistor input drive circuit as defined in claim 5, wherein the rectifying device corresponds to a P-Channel metal oxide semiconductor field effect transistor (P-Ch MOSFET) with a gate, a source, and a drain, where the source of the P-Ch MOSFET corresponds to the first terminal of the rectifying device and is coupled to the first voltage reference, where the gate is coupled to the control signal such that the rectifying device is configured to provide conduction from the first voltage reference to the second terminal during the first state, but not during the second state of the control signal, and where the drain corresponds to the second terminal of the rectifying device.

12. The transistor input drive circuit as defined in claim 5, wherein a transistor that is driven by the transistor input drive circuit corresponds to an N-Channel vertical power JFET.

13. A power supply embodying the gate drive circuit of claim 5.

14. A transistor input drive circuit comprising:
    an input for a control signal;
    an output for a drive signal;
    a first switching circuit coupled to the input, where the first switching circuit is configured to switch on a positive bias to the output in response to a first state of the control signal; and
    a second switching circuit coupled to the input, where the second switching circuit is configured to provide a negative voltage on the output in response to a second state of the control signal.

15. The transistor input drive circuit as defined in claim 14, wherein the second switching circuit is further configured to provide the negative voltage without a negative voltage power supply bias.

16. The transistor input drive circuit as defined in claim 14, wherein the second switching circuit is further configured to provide the negative voltage without a negative voltage power supply bias and without transformer coupling.

17. The transistor input drive circuit as defined in claim 14, wherein the transistor input drive circuit is configured to operate from a single positive voltage power supply bias.

18. The transistor input drive circuit as defined in claim 14, further comprising an input buffer circuit disposed between the input and the first switching circuit and between the input and the second switching circuit, where the input buffer circuit is configured to provide a high input impedance to the input and is configured to provide a low output impedance to the first switching circuit and to the second switching circuit.

19. A power supply embodying the gate drive circuit of claim 14.

20. A circuit comprising:
    an input for a control signal;
    a first switching circuit coupled to the input, where the first switching circuit is configured to switch on a positive bias to a drive output in response to a first state of the control signal;
    a second switching circuit coupled to the input, where the second switching circuit is configured to provide a negative voltage on the drive output in response to a second state of the control signal; and
    a power junction field effect transistor (power JFET) with a gate, a source, and a drain, where the gate is coupled to the drive output, where the source is coupled to a voltage reference, and the drain is configured to be coupled to a load.

21. The circuit as defined in claim 20, wherein the voltage reference is ground.

22. The circuit as defined in claim 20, wherein the second switching circuit is further configured to provide the negative voltage without a negative voltage power supply bias.

23. A power supply embodying the circuit of claim 20.

24. A transistor input drive circuit comprising:
    means for receiving a control signal as an input, where the control signal has a first state and a second state;
    means for providing a positive bias on an output of the transistor drive circuit in response to the first state of the control signal;
    a capacitor with a first terminal and a second terminal, where the second terminal is coupled to the output of the transistor input drive circuit;
    means for charging the capacitor by coupling a positive voltage reference to the first terminal of the capacitor in response to the first state of the control signal; and
    means for switching the first terminal of the capacitor to a second voltage reference that is lower in voltage than the positive voltage reference to provide a negative bias on the output of the transistor drive circuit in response to the second state of the control signal.

25. The transistor input drive circuit as defined in claim 24, wherein the second voltage reference is ground.

26. The transistor input drive circuit as defined in claim 24, wherein the means for charging the capacitor charges the capacitor through a current flow path that includes an input of a device coupled to the output of the transistor input drive circuit.

27. A method of driving a power transistor, the method comprising:
    receiving a control signal as an input, where the control signal has a first state and a second state;
    providing a positive bias to an input of the power transistor in response to the first state, where the positive bias can drive the power transistor to an "on" state;
    charging a capacitor in response to the first state, where a charging current for the capacitor flows into a first terminal of the capacitor and flows through a path including the input of the power transistor;
    disabling the positive bias in response to a second state; and
    switching the first terminal of the capacitor to a voltage reference in response to the second state such that a second terminal of the capacitor provides a negative voltage as an output to the input of the power transistor, where the negative voltage can drive the power transistor to an "off" state.

28. The method as defined in claim 27, where the voltage reference is ground.

29. The method as defined in claim 27, further comprising buffering the control signal.

30. The method as defined in claim 27, wherein the positive bias is provided to the power transistor by switching voltage to a resistor that is coupled to the input of the power transistor.

31. The method as defined in claim 27, wherein the power transistor is an N-Channel vertical power junction field effect transistor (JFET).

* * * * *

UNITED STATES PATENT AND TRADEMARK OFFICE
CERTIFICATE OF CORRECTION

| | | |
|---|---|---|
| PATENT NO. | : 6,741,099 B1 | |
| APPLICATION NO. | : 10/357313 | |
| DATED | : May 25, 2004 | |
| INVENTOR(S) | : Krugly | |

It is certified that error appears in the above-identified patent and that said Letters Patent is hereby corrected as shown below:

On title page (75) Item

On the front cover, with respect to the listing of the Inventors, please add the following Inventor: Daniel Chang The listing of Inventors should therefore read as follows:

Simon Krugly, Camarillo, California; and
David Chang, Fremont, California

Signed and Sealed this

Fifth Day of September, 2006

JON W. DUDAS
*Director of the United States Patent and Trademark Office*